(12) United States Patent
Lee

(10) Patent No.: US 7,746,714 B2
(45) Date of Patent: Jun. 29, 2010

(54) SEMICONDUCTOR MEMORY DEVICE HAVING BIT-LINE SENSE AMPLIFIER

(75) Inventor: Sang-Hee Lee, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 354 days.

(21) Appl. No.: 12/003,551

(22) Filed: Dec. 28, 2007

(65) Prior Publication Data

US 2008/0205180 A1  Aug. 28, 2008

(30) Foreign Application Priority Data

Feb. 23, 2007  (KR) ...................... 10-2007-0018308

(51) Int. Cl.
*G11C 7/00* (2006.01)

(52) U.S. Cl. ...................... 365/207; 365/194

(58) Field of Classification Search .................. 365/196
See application file for complete search history.

(56) References Cited

U.S. PATENT DOCUMENTS

| | | | | |
|---|---|---|---|---|
| 4,425,633 A | * | 1/1984 | Swain | ......................... 365/194 |
| 5,251,180 A | * | 10/1993 | Ohshima | ............... 365/230.03 |
| 5,315,550 A | * | 5/1994 | Tobita | ......................... 365/194 |
| 5,596,538 A | * | 1/1997 | Joo | ............................. 365/201 |
| 5,719,820 A | * | 2/1998 | Fuji | ......................... 365/233.5 |
| 5,966,337 A | | 10/1999 | Lee et al. | |
| 6,043,685 A | | 3/2000 | Lee | |
| 6,097,653 A | | 8/2000 | Park | |
| 6,111,796 A | * | 8/2000 | Chang et al. | ................. 365/196 |
| 6,347,058 B1 | | 2/2002 | Houghton et al. | |

FOREIGN PATENT DOCUMENTS

| | | |
|---|---|---|
| JP | 10-340583 | 12/1998 |
| JP | 2006-031922 | 2/2006 |
| KR | 1020060026590 | 3/2006 |

OTHER PUBLICATIONS

Notice of Allowance issued from Korean Intellectual Property Office on Feb. 27, 2009 with an English Translation.

* cited by examiner

*Primary Examiner*—Tan T. Nguyen
(74) *Attorney, Agent, or Firm*—IP & T Law Firm PLC

(57) ABSTRACT

A semiconductor memory device including a bit-line sense amplifier is not affected by variation in manufacturing process and has a stable driving scheme. The semiconductor memory device includes: a unit memory cell for storing a data; a sense amplification unit including a bit-line sense amplifier (BLSA) for sensing and amplifying a voltage difference of a bit-line pair receiving the data of the unit memory cell; a variation detection unit for detecting a variation of a manufacturing process to output a detecting signal; and a sense amplifier controlling unit for controlling the BLSA to be activated after a predetermined time from an activation of unit memory cell in response to the detecting signal.

12 Claims, 6 Drawing Sheets

SEMICONDUCTOR MEMORY DEVICE HAVING BIT-LINE SENSE AMPLIFIER

CROSS-REFERENCE TO RELATED APPLICATIONS

This application claims priority of Korean patent application number 10-2007-0018308, filed on Feb. 23, 2007, which is incorporated by reference in its entirety.

BACKGROUND OF THE INVENTION

The subject matter relates to semiconductor design technology, and more particularly to a semiconductor memory device including a bit-line sense amplifier to be stably driven even in variation of a production fabrication or a manufacturing process.

Where a low driving voltage is used to implement the power of a memory device, various technical supplements have been used to improve an operation of a sense amplifier in the memory device such as a dynamic random access memory (DRAM). One such supplement is an over-driving scheme of the sense amplifier.

In general, if data of a plurality of memory cells are transferred onto bit-lines, wherein the memory cells are connected to a certain word-line activated by a row address, a bit-line sense amplifier senses and amplifies a voltage difference between two corresponding bit-lines of a bit-line pair.

In the above process, since thousands of bit-line sense amplifiers start to operate simultaneously, a driving time of the bit-line sense amplifiers is determined according to whether or not it is possible to supply a sufficient amount of current for driving the bit-line sense amplifiers.

However, since the operating voltage has been lowered according to a trend of decreased power for the memory device, it is difficult to rapidly supply sufficient current. To solve this problem, an over-driving scheme is adopted so as to supply a voltage higher than a normal voltage, i.e., internal core voltage, onto a power line of the bit-line sense amplifier during an initial operating period of the bit-line sense amplifier (immediately after charge sharing between a cell and a bit-line).

A block diagram and an operation of a conventional semiconductor memory device having an over-driving scheme will be described in detail referring to FIGS. 1 and 2.

FIG. 1 is a circuit diagram of a semiconductor memory device having a conventional over-driving scheme.

As shown, the conventional semiconductor memory device includes a unit memory cell 10, a bit-line sense amplifying unit 20, an equalizing signal generating unit 30, an over-driving unit 40, a first driving power supplying unit NM1, a second driving power supplying unit NM2, a driving power line precharging unit 50 and a data reading path unit 60. The unit memory cell 10 stores a data. The bit-line sense amplifying unit 20 senses and amplifies a voltage difference of a bit-line pair BL and BLB where the data of the memory cell 10 is loaded on. The equalizing signal generating unit 30 generates an equalizing signal BLEQ for precharging the bit-line pair BL and BLB and applies the equalizing signal BLEQ to the bit-line sense amplifying unit 20. The over-driving unit 40 connects an external voltage VDD terminal to a normal voltage supply terminal NODE1 in response to an over-driving pulse OVD. The first driving power supplying unit NM1 supplies a voltage at the normal voltage supply terminal NODE1 to a first driving power line RTO of the bit-line sense amplifying unit 20. The second driving power supplying unit NM2 supplies a ground voltage VSS to a second driving power line SB of the bit-line sense amplifying unit 20. The driving power line precharging unit 50 precharges the first driving power line RTO and the second driving power line SB of the bit-line sense amplifying unit 20. The data reading path unit 60 outputs the data loaded on the bit-line pair BL and BLB to a data pad DQ through transfer lines SIO, SIBO, LIO and LIBO in response to a column-selection signal YI.

The equalizing signal generating unit 30 is embodied by employing a PMOS transistor PM1 and an NMOS transistor NM3 the gates of both transistors receiving a pre-equalizing signal BLEQB and the two transistors connected in series between the external voltage VDD and the ground voltage VSS. The PMOS transistor PM1 receives a source voltage VPP as a substrate voltage and the NMOS transistor NM3 receives a source voltage VBB as a substrate voltage.

FIG. 2 is a timing diagram illustrating signal levels while accessing the semiconductor memory device shown in FIG. 1.

First, if an active command and a low address are input, bit-line splitting signals BISH and BISL are deactivated so that only corresponding unit memory cell array is connected to the bit-line sense amplifying unit 20. Further, as the equalizing signal generating unit 30 deactivates the equalizing signal BLEQ, so as to no longer supply a precharging voltage VBLP to the bit-line pair BL and BLB, an input of data is prepared.

Subsequently, if a corresponding word line WL is activated by the active command, the data of the unit memory cell 10 is loaded on the bit-line pair BL and BLB with a fine voltage difference ΔV.

As first and second enable signals SAP and SAN are activated, the first and second driving power supplying units NM1 and NM2 respectively supply the external voltage VDD and the ground voltage VSS to the first and second driving power lines RTO and SB of the bit-line sense amplifying unit 20. At this time, during a startup driving of the bit-line sense amplifying unit 20, the over-driving unit 40 supplies the external voltage VDD to the normal voltage supply terminal NODE1 in response to an activation of the over-driving pulse OVD so that the first driving power supplying unit NM1 supplies sufficient current to the first driving power line RTO, thereby accomplishing an over-driving. Hereafter, if the over-driving pulse OVD is deactivated, the first driving power supplying unit NM1 drives the first driving power line RTO with a normal voltage VCORE loaded on the normal voltage supply terminal NODE1 because the over-driving unit 40 does not supply the external voltage VDD to the normal voltage supply terminal NODE1. Therefore, the bit-line sense amplifying unit 20 is activated by the first and second driving power lines RTO and SB so as to detect a voltage difference of the bit-line pair BL and BLB and amplify it.

The data loaded on the bit-line pair BL and BLB is output to the data pad DQ through the data reading path unit 60 including the transfer lines SIO, SIOB, LIO and LIOB in response to the column-selection signal YI.

The corresponding word line WL is deactivated based on a precharging command. Because the equalizing signal generating unit 30 activates the equalizing signal BLEQ, the bit-line sense amplifying unit 20 precharges the bit-line pair BL and BLB in response to the activation of the equalizing signal BLEQ. In addition, the driving power line precharging unit 50 precharges the first and second driving power lines RTO and SB of the bit-line sense amplifying unit 20.

Further, as the bit-line splitting signals BISH and BISL are activated, adjacent unit memory cells 10 also share the bit-line sense amplifying unit 20 with each other.

For reference, as described with respect to FIG. 1, a time from activating of the word line WL to activating of the bit-line sense amplifying unit 20 is referred to as a 'Sensing Margin Delay'. If the sensing margin delay shortens, the bit-line sense amplifying unit 20 reaches an active state such that the fine voltage difference ΔV input to the bit-line pair BL and BLB is not guaranteed after the word line WL is activated. Accordingly, a data error may occur by detecting and amplifying an erroneous data.

As described above, a conventional controlling unit for guaranteeing the sensing margin delay to drive the bit-line sense amplifying unit 20 will be described in detail.

FIG. 3 is a circuit diagram of a conventional bit-line sense amplifier driving controller of the semiconductor memory device shown in FIG. 1.

As shown, the bit-line driving controller includes a signal input unit 70 and a RC delay unit 80. The signal input unit 70 detects an active pulse ACTB_PULSE and a precharging pulse PCGB_PULSE. The RC delay unit 80 adds a sensing margin delay to an output signal of the signal input unit 70 to output a sense amplifier enable signal BLSA_EN.

Herein, the signal input unit 70 activates the output signal to a logic high level in response to the active pulse ACTB_PULSE, and deactivates the output signal to a logic low level in response to the precharging pulse PCGB_PULSE.

Further, the RC delay unit 80 includes an inverter chain for delaying the output signal of the signal input unit 70 to output the sense amplifier enable signal BLSA_EN. A plurality of inverters provided in the inverter chain includes an active resistor and a capacitor at an output terminal of a respective inverter.

Hereinafter, a driving of the bit-line driving controller shown in FIG. 3 will be described briefly.

If the active pulse ACTB_PULSE is activated, the signal input unit 70 activates and outputs its own output signal with a logic high level. The RC delay unit 80 outputs the sense amplifier enable signal BLSA_EN by adding the RC delay according to the active resistors and the capacitors to the output signal of the signal input unit 70.

Thereafter, if the precharging pulse PCGB_PULSE is inputted, the sense amplifier enable signal BLSA_EN is inactivated since the signal input unit 70 inactivates the output signal to a logic low level.

Accordingly, the first and second enable signals SAP and SAN for supplying a driving power voltage of the bit-line sense amplifier are activated in response to the sense amplifier enable signal BLSA_EN.

As described above, the conventional bit-line driving controller enforces the sensing margin delay through the RC delay unit 80. Particularly, the RC delay unit 80 includes the active resistor embodied in an N+ active resistor in consideration of a layout size and process, voltage and temperature (PVT) fluctuation.

However, because the N+ active resistor is affected by variation in a production fabrication or a manufacturing process, it has problem that the resistance value may be fluctuated widely. If a resistance value of the N+ active resistor becomes high, a row to column delay (tRCD) property degrades, but a data error does not occur. However, if the resistance value becomes too low, the sensing margin delay is decreased. Accordingly, before the fine voltage difference ΔV is sufficiently supplied to the bit-line pair BL and BLB, the bit-line sense amplifier may become active so that erroneous data may be detected and amplified.

Therefore, the sensing margin delay may widely fluctuate based on variation in the manufacturing process, and thus, erroneous data from the memory cell may be detected.

SUMMARY OF THE INVENTION

Embodiments of the present invention are directed to providing a semiconductor memory device that includes a bit-line sense amplifier capable of stably operating despite variation in a manufacturing process.

In accordance with an aspect of the present invention, there is provided a semiconductor memory device, including: a unit memory cell for storing a data; a sense amplification unit including a bit-line sense amplifier for sensing and amplifying difference of a voltage level of a bit-line pair receiving the data of the unit memory cell; a variation detection unit for detecting a variation of a manufacturing process to output a detecting signal; and a sense amplifier controlling unit for controlling the bit-line sense amplifier to be activated after a predetermined time from an activation of the unit memory cell in response to the detecting signal.

In accordance with another aspect of the present invention, there is provided a semiconductor memory device, including: a signal input unit for receiving a startup flag and an end flag to generate an activation section signal; an RC delay unit including an active resistor, for adding an RC delay to the activation section signal; a variation detection unit for activating a detecting signal by detecting a variation of a resistance value of the active resistor; and an additional delay unit for adding an additional delay to the output signal of the RC delay unit in response to the detecting signal to output a driving signal.

DESCRIPTION OF SPECIFIC EMBODIMENTS

Figure 4:
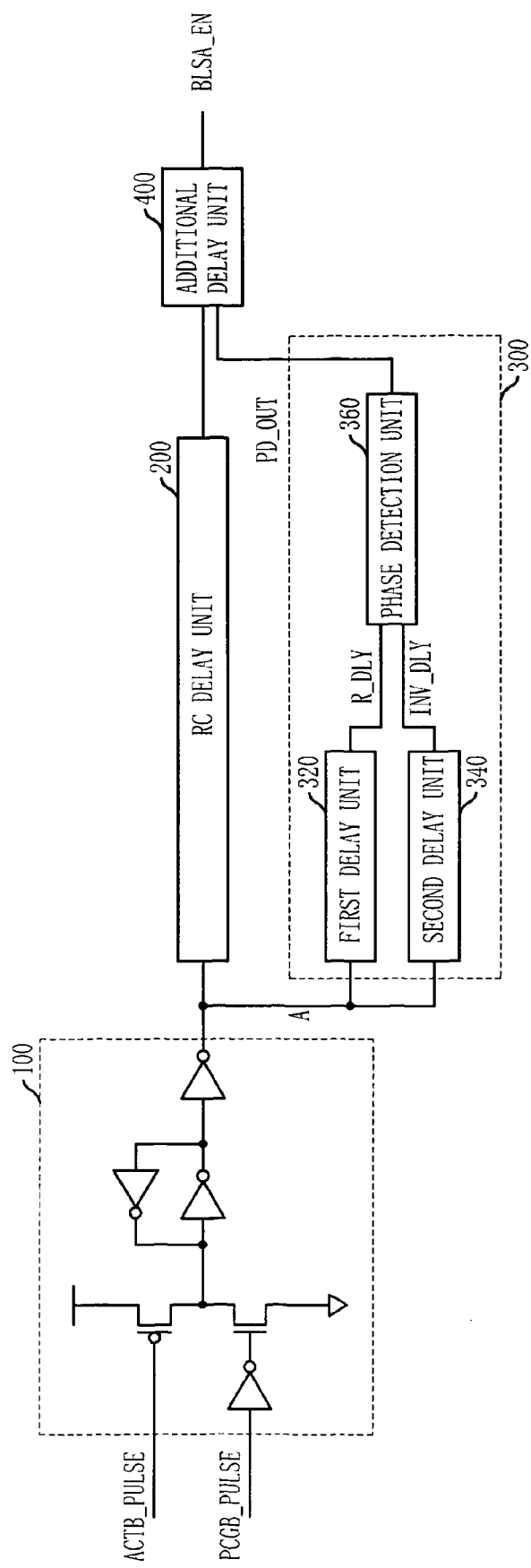
FIG. 4 is a block diagram of a bit-line sense amplifier driving controller of a semiconductor memory device in accordance with an embodiment of the present invention.

FIG. 4 is a block diagram of a bit-line sense amplifier driving controller of a semiconductor memory device in accordance with a first embodiment of the present invention.

As shown, the bit-line sense amplifier (BLSA) driving controller includes a signal input unit 100, a RC delay unit 200, a variation detection unit 300 and an additional delay unit 400. The signal input unit 100 outputs an activation section signal A based on an active signal ACTB_PULSE and a precharging signal PCGB_PULSE. The RC delay unit 200 adds an RC delay to the activation section signal A. The variation detecting unit 300 detects a variation of a resistance value of an active resistor. The additional delay unit 400 adds an additional delay to an output signal of the RC delay unit 200 or outputs a sense amplifier enable signal BLSA_EN without adding the additional delay in response to an output signal of the variation detection unit 300.

The variation detection unit 300 includes a first delay unit 320, a second delay unit 340, and a phase detection unit 360. The first delay unit 320 includes an active resistor for delaying the activation section signal A to output a resistance delay R_DLY. The second delay unit 340 delays the activation section signal A to output an inverter delay INV_DLY. The phase detection unit 360 detects which is activated first between the resistance delay R_DLY and the inverter delay INV_DLY to output a detecting signal PD_OUT. For reference, the first delay unit 320 and the second delay unit 340 are designed to have the same delay value when there are no influences due to surrounding factors such as a manufacturing process.

Figure 1:
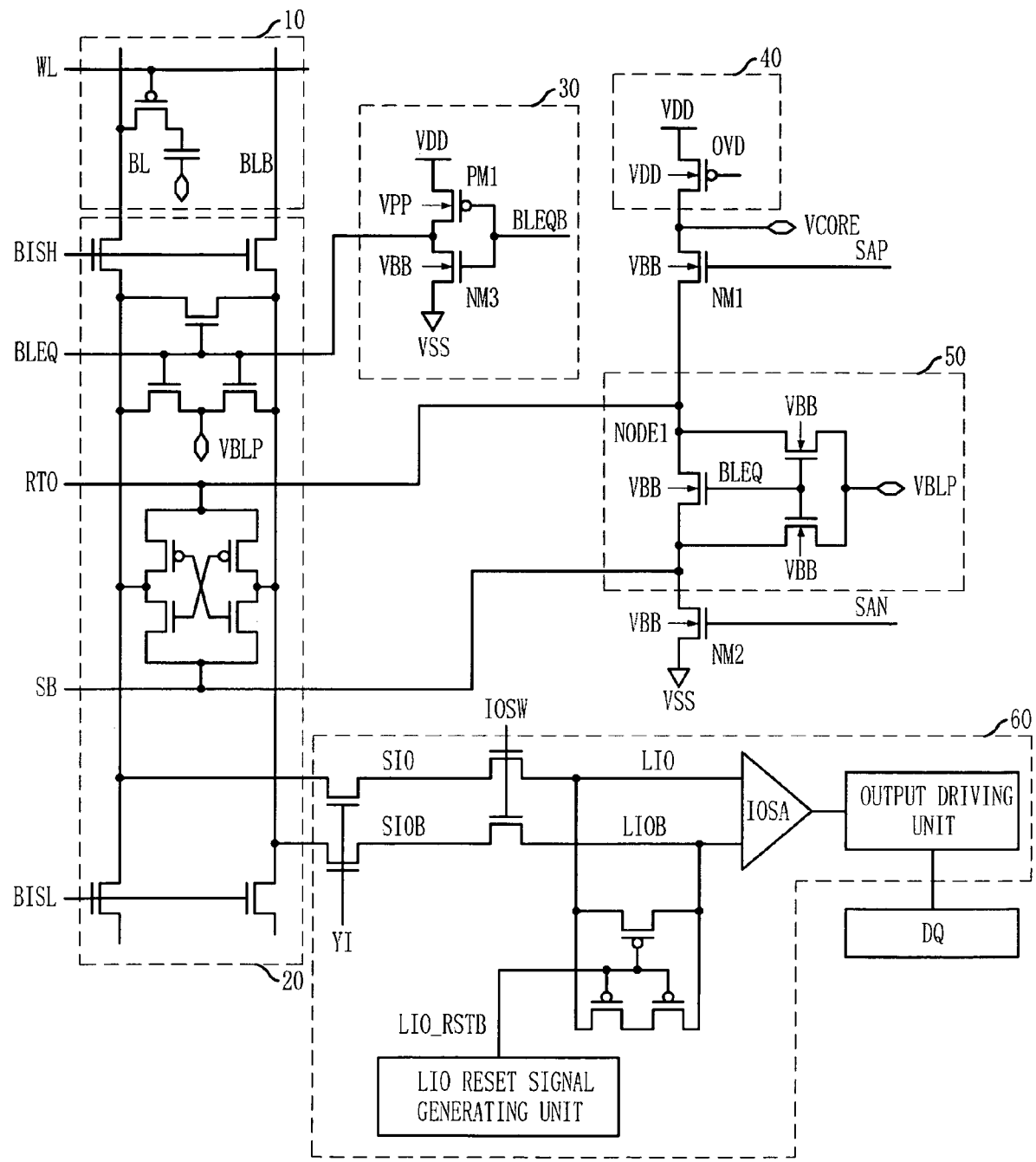
FIG. 1 is a block diagram of a semiconductor memory device having a conventional over-driving scheme.
Figure 2:
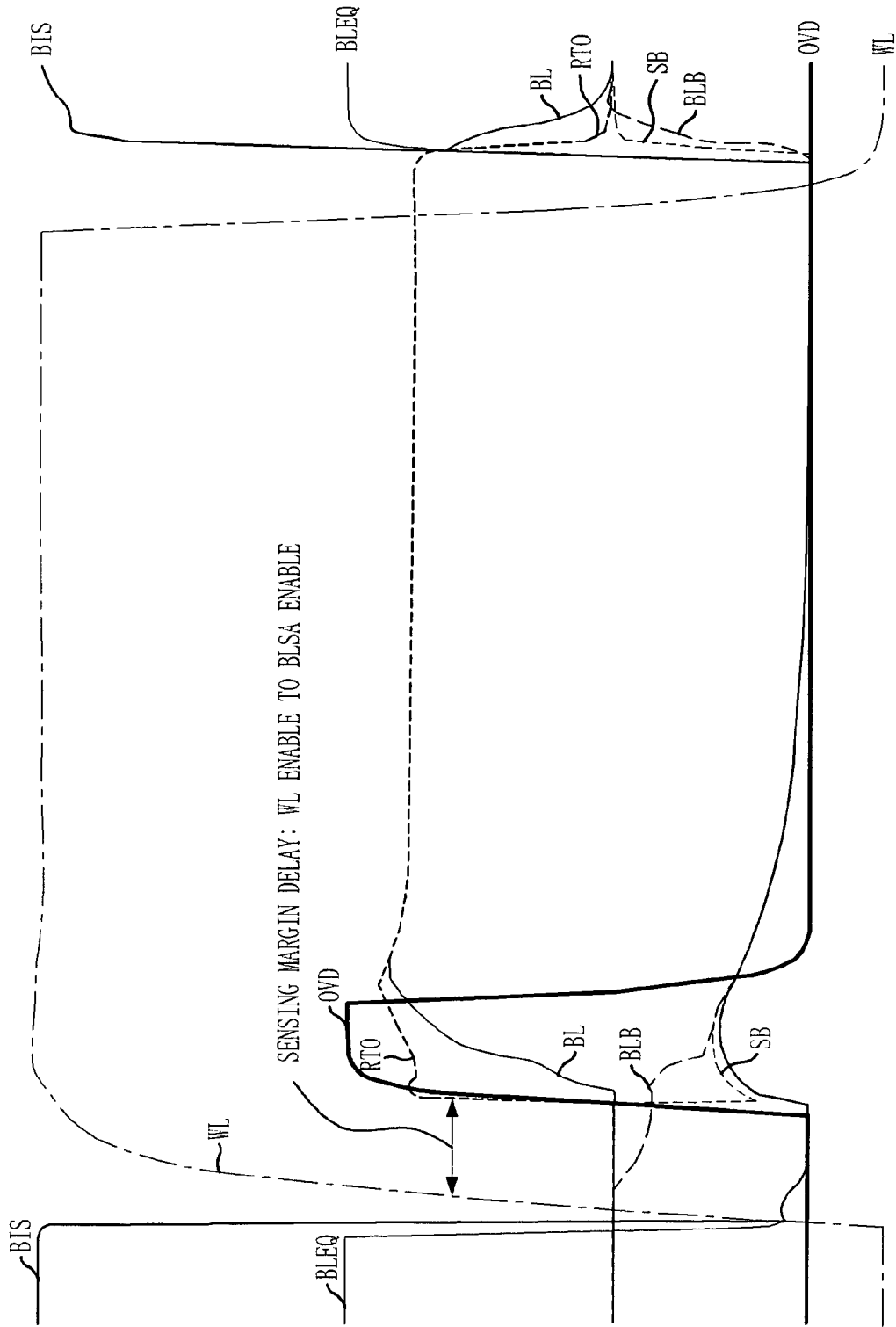
FIG. 2 is a timing diagram illustrating signal levels while accessing the semiconductor memory device shown in FIG. 1.
Figure 3:
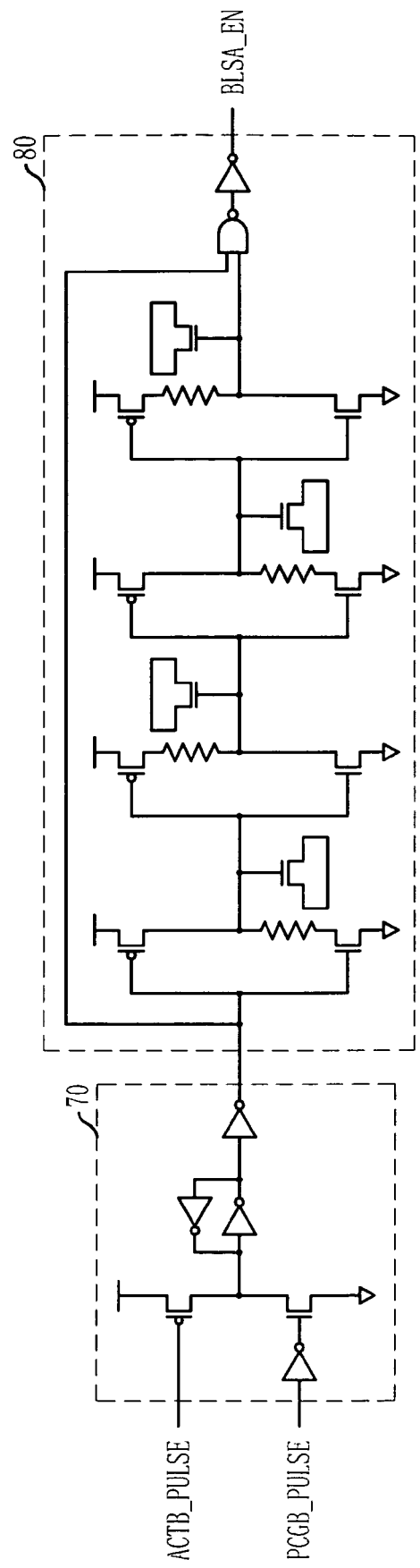
FIG. 3 is a circuit diagram of a conventional bit-line sense amplifier driving controller of the semiconductor memory device shown in FIG. 1.

Further, the first embodiment includes an unit memory cell for storing a data and a sense amplifying unit including a bit-line sense amplifier for sensing and amplifying the data of the unit memory cell, similar to the conventional device illustrated in FIG. 1. That is, the sense amplifier enable signal BLSA_EN is used to a control signal for driving the bit-line sense amplifier.

As described above, the BLSA driving controller in accordance with the first embodiment includes the variation detection unit 300 and the additional delay unit 400. Therefore, the BLSA driving controller detects a case where a resistance value of the active resistor is decreased through the variation detection unit 300 and in response adds the additional delay through the additional delay unit 400. When the resistance value of the active resistor fluctuates according to variation of the manufacturing process, the additional delay unit 400 compensates for the fluctuating resistance value. Accordingly, it is possible to prevent a data error caused by the decreased resistance value of the active resistor as compared with conventional devices.

Figure 5:
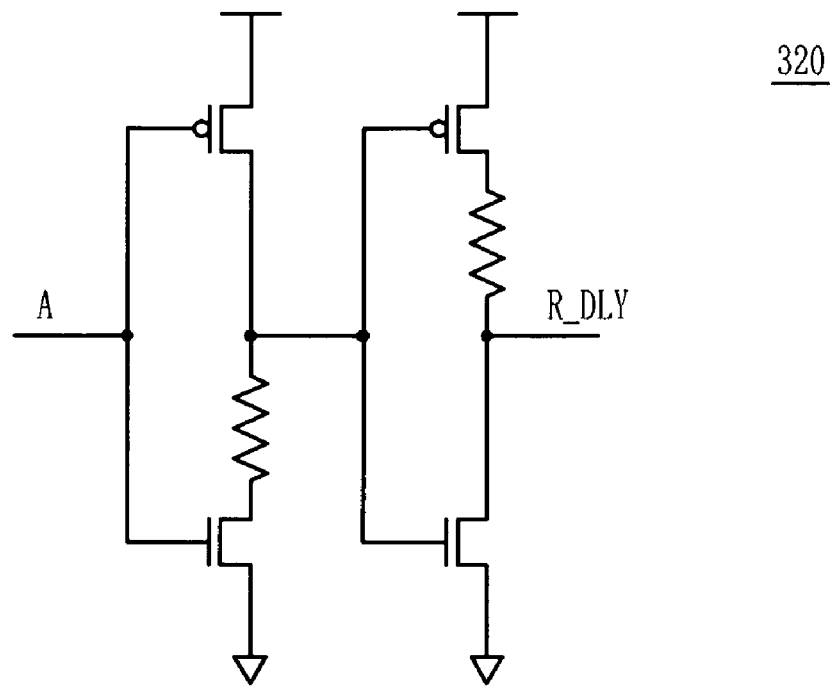
FIG. 5 is a circuit diagram illustrating a first delay unit shown in FIG. 4.

FIG. 5 is a circuit diagram illustrating the first delay unit 320 shown in FIG. 4.

The first delay unit 320 includes an inverter chain for delaying the activation section signal A. Each inverter has an active resistor at its output terminal. In the first embodiment, the active resistors are embodied by using N+ active resistors.

The resistance delay R_DLY is a delayed signal which is generated by delaying the activation section signal A with a predetermined delay value introduced by the inverter chain. The predetermined delay value is affected by variation in a resistance value of the active resistors due to variation of the production fabrication and the manufacturing process.

Figure 6:
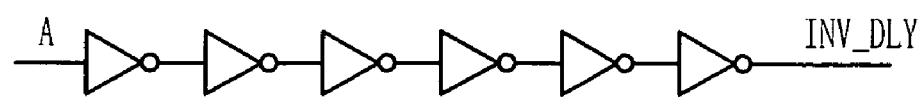
FIG. 6 is a circuit diagram illustrating a second delay unit shown in FIG. 4.

FIG. 6 is a circuit diagram illustrating the second delay unit 340 illustrated in FIG. 4.

The second delay unit 340 includes an inverter chain for delaying the activation section signal A.

The second delay unit 340 does not include the active resistor, unlike the first delay unit 320. Therefore, a delay value of the second delay unit 340 does not change due to variation of a resistance value of an active resistor.

Figure 7:
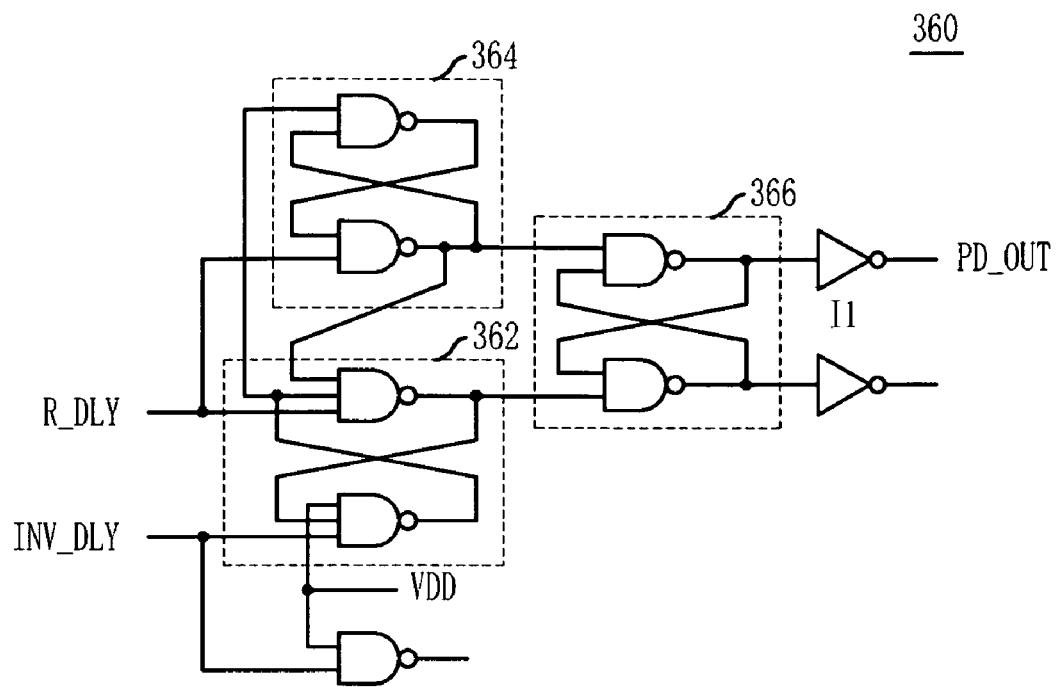
FIG. 7 is a circuit diagram illustrating a phase detection unit shown in FIG. 4.

FIG. 7 is a circuit diagram illustrating the phase detection unit 360 shown in FIG. 4.

The phase detection unit 360 includes a first Reset-Set (RS) latch unit 362, a second Reset-Set (RS) latch unit 364, a third Reset-Set (RS) latch unit 366 and an inverter I1. The first RS latch unit 362 receives the resistance delay R_DLY as a set signal, and the inverter delay INV_DLY as a reset signal. The second RS latch unit 364 receives the resistance delay R_DLY as a set signal, and a negative output signal of the first RS latch unit 362 as a reset signal. The third RS latch unit receives a positive output signal of the second RS latch unit 364 as a set signal, and a positive output signal of the first RS latch unit 362 as a reset signal. The inverter I1 inverts a positive output signal of the third RS latch unit 366 to output the detecting signal PD_OUT.

In the illustrated embodiment, the first to third RS latch units 362, 364 and 366 are each embodied in a cross-coupled NAND gate.

Hereinafter, an operation of the variation detection unit 300 illustrated in FIG. 4 will be described.

When the resistance value of the active resistor decreases sufficiently due to variation of the manufacturing process, the delay value of the first delay unit 320 is shorter than that of the second delay unit 340, because the resistance value of the active resistor is decreased even though the first delay unit 320 and the second delay unit 340 are designed to have the same delay. Therefore, the resistance delay R_DLY is activated earlier than the inverter delay INV_DLY. The phase detection unit 360 activates the detecting signal PD_OUT to a logic high level in response to the resistance delay R_DLY.

On the other hand, when the resistance value of the active resistor increases, the delay value of the first delay unit 320 is longer than that of the second delay unit 340. Therefore, the inverter delay INV_DLY is activated earlier than the resistance delay R_DLY, and thus, the phase detection unit 360 deactivates the detecting signal to a logic low level in response to the inverter delay INV_DLY.

Figure 8:
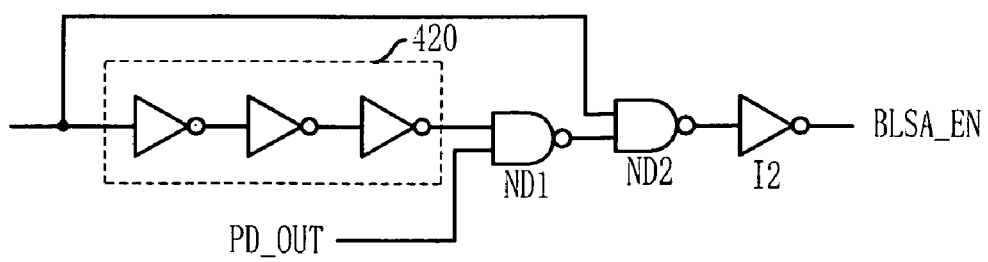
FIG. 8 is a circuit diagram illustrating an additional delay unit shown in FIG. 4.

FIG. 8 is a circuit diagram illustrating the additional delay unit 400 shown in FIG. 4.

As illustrated, the additional delay unit 400 includes an inverter chain 420, a first NAND gate ND1, a second NAND gate ND2 and an inverter I2. The inverter chain 420 delays and inverts the output signal of the RC delay unit 200. The first NAND gate ND1 receives an output signal of the inverter chain 420 and the detecting signal PD_OUT. The second NAND gate ND2 receives an output signal of the first NAND gate ND1 and the output signal of the RC delay unit 200. The inverter I2 inverts an output signal of the second NAND gate ND2 to output the sense amplifier enable signal BLSA_EN.

Hereinafter, an operation of the additional delay unit 400 will be described briefly. If the detecting signal PD_OUT is activated to a logic high level, the additional delay unit 400 adds a delay of the inverter chain, i.e., the additional delay, to the output signal of the RC delay unit 200 to output the bit-line sense amplifier enable signal BLSA_EN. However, if the detecting signal PD_OUT is deactivated to a logic low level, the additional delay unit 400 outputs the output signal of the RC delay unit 200 as the bit-line sense amplifier enable signal BLSA_EN without adding the additional delay.

As described above, in the semiconductor memory device of present invention, the first delay unit 320 having the active resistor and the second delay unit 340 without an active resistor are designed to have the same delay. The activation section signal A is input to both of the first delay unit 320 and the second delay unit 340, and the phase detection unit 360 detects the relative delay. When the delay of the first delay unit 320 having the active resistor is lower than that of the second delay unit 340, the phase detection unit 360 activates the detecting signal PD_OUT and the additional delay unit 400 adds the additional delay to the output of the RC delay unit 200.

Accordingly, the semiconductor memory device detects a case that the active resistor is decreased due to variation of the manufacturing process, and compensates for effect of the decreased resistance value by adding the additional delay through the additional delay unit 400.

Thus, the semiconductor memory device in accordance with the present invention can guarantee the sensing margin delay from an activation of an active signal in spite of variations of the manufacturing process. Since a sufficient fine voltage difference ΔV is guaranteed in the bit-line, a data is stably guaranteed.

On the other hand, although the present invention as described above illustrates only a case of generating a control signal for controlling the BLSA with including a regular delay time from an activation of the active signal, it can be more broadly applied to a case in which a delay device including an active resistor generates a signal.

While the present invention has been described with respect to the specific embodiments, it will be apparent to those skilled in the art that various transpositions, changes, and modifications may be made without departing from the spirit and scope of the invention as defined in the following claims.

What is claimed is:

1. A semiconductor memory device, comprising:
    a unit memory cell for storing a data;
    a sense amplifying unit including a bit-line sense amplifier (BLSA) for sensing and amplifying a voltage difference of a bit-line pair receiving the data of the unit memory cell;
    a variation detection unit for detecting a variation of a manufacturing process to output a detecting signal; and
    a sense amplifier controlling unit for controlling the BLSA to be activated after a predetermined time from an activation of the unit memory cell in response to the detecting signal.

2. The semiconductor memory device as recited in claim 1, wherein the sense amplifier controlling unit includes:
    a signal input unit for receiving an active signal for activating the unit memory cell and a precharging signal for inactivating the unit memory cell to generate an activation section signal;
    an RC delay unit including an inverter chain, an active resistor, and a capacitor, for adding an RC delay to the activation section signal; and
    an additional delay unit for adding an additional delay to the output signal of the RC delay unit in response to the detecting signal to output a sense amplifier enable signal for activating the BLSA.

3. The semiconductor memory device as recited in claim 2, wherein the additional delay unit includes:
    an inverter chain for delaying and inverting the output signal of the RC delay unit;
    a first NAND gate for receiving the output signal of the inverter chain and the detecting signal;
    a second NAND gate for receiving the output signal of the first NAND gate and the output signal of the RC delay unit; and
    an inverter for inverting the output signal of the second NAND gate to output the sense amplifier enable signal.

4. The semiconductor memory device as recited in claim 1, wherein the variation detection unit includes:
    a first delay unit including a first inverter chain and an active resistor, for outputting a first delayed activation section signal;
    a second delay unit including a second inverter chain, for outputting a second delayed activation section signal; and
    a phase detection unit for detecting which is activated first between the first delayed activation section signal and the second delayed activation section signal to output the detecting signal.

5. The semiconductor memory device as recited in claim 4, wherein the first delay unit and the second delay unit are designed to have approximately the same delay.

6. The semiconductor memory device as recited in claim 4, wherein the phase detection unit includes;
    a first Reset-Set (RS) latch unit for receiving the first delayed activation section signal as a set signal, and the second delayed activation section signal as a reset signal;
    a second RS latch unit for receiving the first delayed activation section signal as a set signal, and a negative output signal of the first RS latch unit as a reset signal;
    a third RS latch unit for receiving a positive output signal of the second RS latch unit as a set signal, and a positive output signal of the first RS latch unit as a reset signal; and
    an inverter for outputting the detecting signal by inverting the positive output of the third RS latch unit.

7. A semiconductor memory device, comprising:
    a signal input unit for receiving a startup flag and an end flag to generate an activation section signal;
    an RC delay unit including an active resistor, for adding an RC delay to the activation section signal;
    a variation detection unit for activating a detecting signal by detecting a variation of a resistance value of the active resistor; and
    an additional delay unit for adding an additional delay to an output signal of the RC delay unit in response to the detecting signal to output a driving signal.

8. The semiconductor memory device as recited in claim 7, wherein the RC delay unit includes an inverter chain and a capacitor.

9. The semiconductor memory device as recited in claim 7, wherein the variation detection unit includes:
    a first delay unit including a first inverter chain and an active resistor, for outputting a first delayed activation section signal;
    a second delay unit including a second inverter chain, for outputting a second delayed activation section signal; and
    a phase detection unit for detecting which is activated first between the first delayed activation section signal and the second delayed activation section signal, to output the detecting signal.

10. The semiconductor memory device as recited in claim 9, wherein the phase detection unit includes;
    a first Reset-Set (RS) latch unit for receiving the first delayed activation section signal as a set signal, and the second delayed activation signal as a reset signal;
    a second RS latch unit for receiving the first delayed activation section signal as a set signal, and a negative output signal of the first RS latch unit as a reset signal;
    a third RS latch unit for receiving a positive output signal of the second RS latch unit as a set signal, and a positive output signal of the first RS latch unit as a reset signal; and
    an inverter for outputting the detecting signal by inverting a positive output of the third RS latch unit.

11. The semiconductor memory device as recited in claim 10, wherein the first delay unit and the second delay unit are designed to have approximately the same delay.

12. The semiconductor memory device as recited in claim 7, wherein the additional delay unit includes:
    an inverter chain for delaying and inverting the output signal of the RC delay unit;
    a first NAND gate for receiving an output signal of the inverter chain and the detecting signal;
    a second NAND gate for receiving an output signal of the first NAND gate and the output signal of the RC delay unit; and
    an inverter for inverting an output signal of the second NAND gate to output the driving signal.

* * * * *